United States Patent [19]

Bronner et al.

[11] Patent Number: 5,057,450
[45] Date of Patent: Oct. 15, 1991

[54] METHOD FOR FABRICATING SILICON-ON-INSULATOR STRUCTURES

[75] Inventors: Gary B. Bronner, Mount Kisco; Paul M. Fahey, Pleasantville; Bernard S. Meyerson, Yorktown Heights, all of N.Y.; Wilbur D. Pricer, Burlington, Vt.

[73] Assignee: International Business Machines Corporation, Armonk, N.Y.

[21] Appl. No.: 678,390

[22] Filed: Apr. 1, 1991

[51] Int. Cl.$^5$ ............................................. H01L 21/76
[52] U.S. Cl. .................................... 437/62; 437/65; 437/67; 437/72; 437/78; 437/927; 437/974; 437/21; 437/203; 148/33.2; 148/33.5; 148/DIG. 135; 357/49; 357/55
[58] Field of Search ................. 437/62, 64, 65, 66, 437/67, 72, 73, 78, 84, 228, 925, 927, 203, 974, 21; 148/33.1, 33.2, 33.3, 33.4, 33.5, DIG. 135, DIG. 164, DIG. 168; 357/47, 49, 55, 56

[56] References Cited

U.S. PATENT DOCUMENTS

| | | | |
|---|---|---|---|
| 3,345,222 | 10/1967 | Nomura et al. | 38/51 |
| 3,607,480 | 9/1971 | Harrap et al. | 156/17 |
| 3,731,375 | 5/1973 | Agusta et al. | 29/577 |
| 4,125,427 | 11/1978 | Chen et al. | 156/657 |
| 4,760,036 | 7/1988 | Schubert | 437/62 |
| 4,786,609 | 11/1988 | Chen | 437/44 |
| 4,829,018 | 5/1989 | Wahlstrom | 148/DIG. 135 |
| 4,888,300 | 12/1989 | Burton | 437/62 |
| 4,925,805 | 5/1990 | van Ommen et al. | 437/67 |
| 4,929,571 | 5/1990 | Omura et al. | 437/65 |
| 4,982,263 | 1/1991 | Spratt et al. | 437/72 |

Primary Examiner—Brian E. Hearn
Assistant Examiner—T. N. Quach
Attorney, Agent, or Firm—John J. Goodwin

[57] ABSTRACT

A fabrication method for forming SOI structures where perfect material is grown epitaxially on a substrate and then, through a series of selective etches and oxidations, an insulating layer is formed below the epitaxial silicon. In the method, low temperature epitaxial techniques are employed to grow a layered structure including a first layer p++ silicon on a substrate wafer, a layer of intrinsic silicon is then formed on the first p++ silicon layer, and a second layer of p++ silicon is formed on the intrinsic silicon layer, and a finally a layer of p-silicon is fabricated on top of the second p++ silicon layer. Grooves are formed through the p-layer, the second p++ silicon layer, the intrinsic silicon layer, and stopped in the first p++ silicon layer. An etch is then employed to remove the intrinsic layer long enough for the p++ silicon layer to be totally undercut, leaving an air gap between the two p++ silicon layers. An oxidation step is then performed to form a bottom insulator consisting of the oxidized first p++ silicon layer and on an upper insulator consisting of the oxidized second p++ silicon layer.

8 Claims, 2 Drawing Sheets

METHOD FOR FABRICATING SILICON-ON-INSULATOR STRUCTURES

BACKGROUND OF THE INVENTION

1. Field of the Invention

The present invention relates to methods for obtaining silicon-on-insulator structures, and more particularly to a method for forming defect-free silicon epitaxially and forming an insulating layer below the epitaxial silicon.

2. Brief Description of the Prior Art

U.S. Pat. No. 3,345,222 issued Oct. 3, 1967, to Nomura et al, and entitled METHOD OF FORMING A SEMICONDUCTOR DEVICE BY ETCHING AND EPITAXIAL DEPOSITION discloses a method for forming a semiconductor by placing a semiconductor element sample such as silicon and germanium in a quartz reaction tube, etching with a vapor phase of halogenated semiconductor material and hydrogen to form an epitaxial layer of opposite conductivity to form on the semiconductor material, and finally forming a silicon dioxide coat on the surface of the semiconductor material.

U.S. Pat. No. 4,125,427, issued Nov. 14, 1978 to Chen et al and entitled METHOD OF PROCESSING A SEMICONDUCTOR discloses a method for processing a semiconductor comprising growing a first silicon dioxide layer by oxidizing the substrate, forming a silicon nitride layer over the first SiO2 layer, growing a masking oxide layer by chemical vapor deposition. A photoresist mask is then applied to selected areas of the masking oxide layer to mask the area under which the drain, source and channel areas will appear in the substrate. The unmasked areas will represent the regions on which field oxide will be grown.

U.S. Pat. No. 4,786,609, issued Nov. 22, 1988 to Chen and entitled METHOD OF FABRICATING FIELD-EFFECT TRANSISTOR UTILIZING IMPROVED GATE SIDEWALL SPACERS, discloses a method for manufacturing a semiconductor by first forming a structure in which a dielectric layer lies along the upper surface of a major doped region of a semiconductor body. A patterned insulating cover layer overlies a similarly patterned doped layer of non-monocrystalline semiconductor material lying on the dielectric layer. The cover layer is silicon nitride. If a lightly doped drain architecture is desired, a preliminary semiconductor dopant is implanted at a low dosage into selected parts of the major region using the patterned layers as an implantion mask. A further layer of insulating material is deposited onto the upper surface, and largely all of the further layer is removed except for small spacer portions adjoining the sidewalls of the doped non-monocrystalline layer. The thickness of the sidewall spacer portions is now increased by performing a heat treatment to oxidize portions of the doped layer along its sidewalls. Next, a main semiconductor dopant is implanted into selected parts of the major region to define the main S/D regions.

U.S. Pat. No. 3,607,480, issued Dec. 30, 1968 to Harrap et al and entitled PROCESS FOR ETCHING COMPOSITE LAYERED STRUCTURES INCLUDING A LAYER OF FLUORIDE-ETCHABLE SILICON NITRIDE AND A LAYER OF SILICON DIOXIDE, discloses a single step etching process wherein silicon nitride and silicon dioxide are etched at comparable rates with an aqueous etching solution containing hydrogen and fluoride ions. The structure is formed by forming a p-type diffused base region, a relatively heavily N-doped guard or isolation ring, and relatively heavily doped N-type emitter region. During these diffusion steps, a multilevel layer of silicon oxide was sequentially grown after each of the preceding diffusions.

U.S. Pat. No. 3,731,375, issued May 8, 1973 to Agusta et al and entiled MONOLITHIC INTEGRATED STRUCTURE INCLUDING FABRICATION AND PACKAGING THERFOR discloses a method of making an integrated semiconductor structure using, for example, a wafer of p-type conductivity as the starting material, preferably a monocrystalline silicon structure. An initial layer of silicon dioxide is thermally grown, and a photoresist layer is deposited onto the wafer. The desired portions are etched away by an HF solution. An N-region is formed by diffusion, and then an oxidation cycle is effected. After removing the oxide layer, a region of N type conductivity is epitaxially grown on the surface of the wafer. Another dioxide layer is formed on the surface of the epitaxially grown region either by thermal oxidation, by pyrolytic deposition, or by RF sputtering. A number of openings are formed in specific areas of the oxide layer by standard photolithographic masking and etching techniques. A second diffusion operation is performed for isolation of the active and passive devices to be formed and, if desired, to form underpass connectors.

SUMMARY OF THE INVENTION

An object of the present invention is to provide a method for forming a silicon-on-insulator structure that allows the growth of defect-free material epitaxially. Another object of the present invention is to provide a method for forming a silicon-on-insulator structure having a defect-free epitaxial layer and forming an insulator layer below the epitaxial layer by a series of selective etching.

A further object of the present invention is to provide a silicon-on-insulator structure wherein a layer of defect-free silicon is disposed on an oxide/air gap insulator.

DESCRIPTION OF THE PREFERRED EMBODIMENT

Silicon-on-insulator (SOI) is a structure that is significantly useful as a substrate for bipolar and CMOS devices because of its resistance to soft error and elimination of parasitic capacities. Known SOI fabrication techniques such as recrystallization of silicon over oxide, wafer bonding and lateral epitaxial overgrowth suffer from high defect density compared to conventional silicon wafers.

The present invention provides a fabrication method for forming SOI structures wherein perfect material is grown epitaxially on a substrate and then, through a series of selective etches and oxidations, an insulating layer is formed below the epitaxial silicon.

Figure 1:
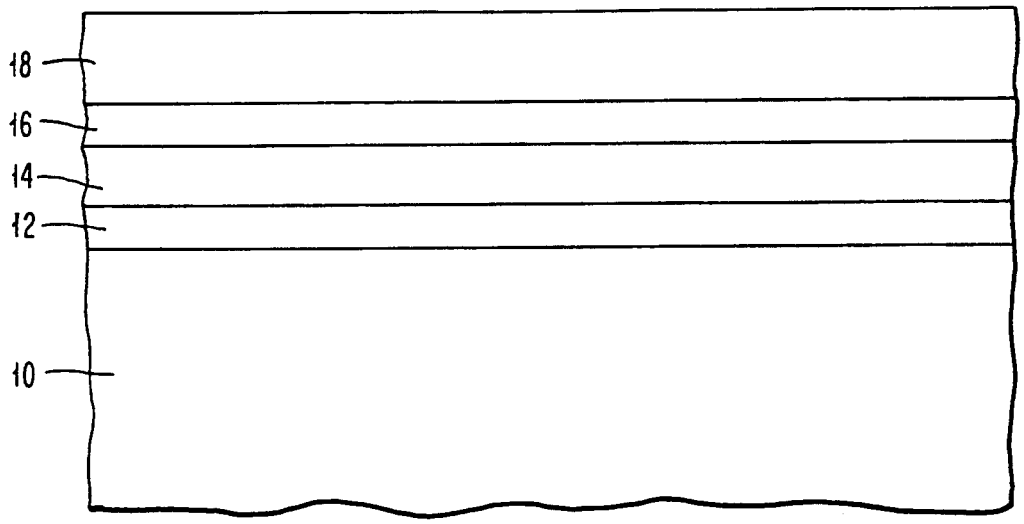
FIGS. 1, 2, 3 and 4 are schematic illustrations of a cross section of a silicon-on-insulator structure during successive steps in the fabrication method therefor.

Referring to FIG. 1, a cross-sectional illustration of a conventional silicon wafer 10 is shown as the starting material for the process. Low temperature epitaxial techniques are employed to grow a layered structure including a first layer 12 of p++ silicon on the wafer 10, a layer of intrinsic silicon 14 on the first p++ silicon layer 12, another layer of p++ silicon 16 on intrinsic silicon layer 14, and a layer of p-silicon 18 on top of the second p++ silicon layer 16.

Figure 2:
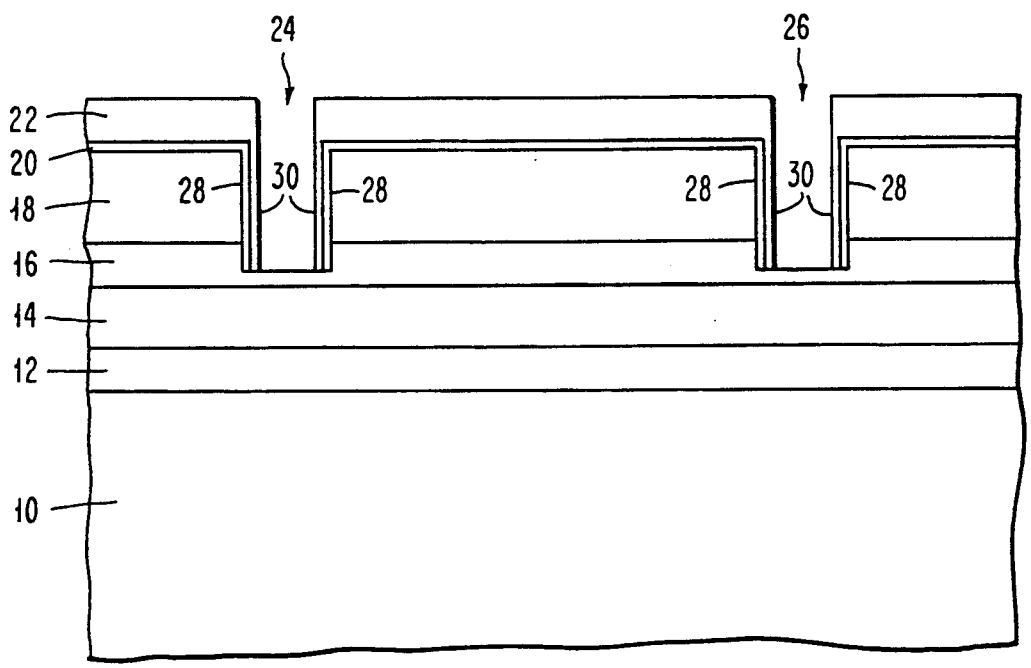

As shown in FIG. 2, a thin layer 20 of SiO$_2$ and a thin layer 22 of Si$_3$N$_4$ are deposited on top of the structure of FIG. 1 using conventional low temperature deposition techniques, and then grooves 24 and 26 are formed through layers 20, 22 and 18 and stopped in the p++ silicon layer 16.

A layer 28 of SiO$_2$ and a layer 30 of Si$_3$N$_4$ which provide sidewalls for the grooves 24 and 26 are formed by conventional deposition and reactive ion etch techniques.

Figure 3:
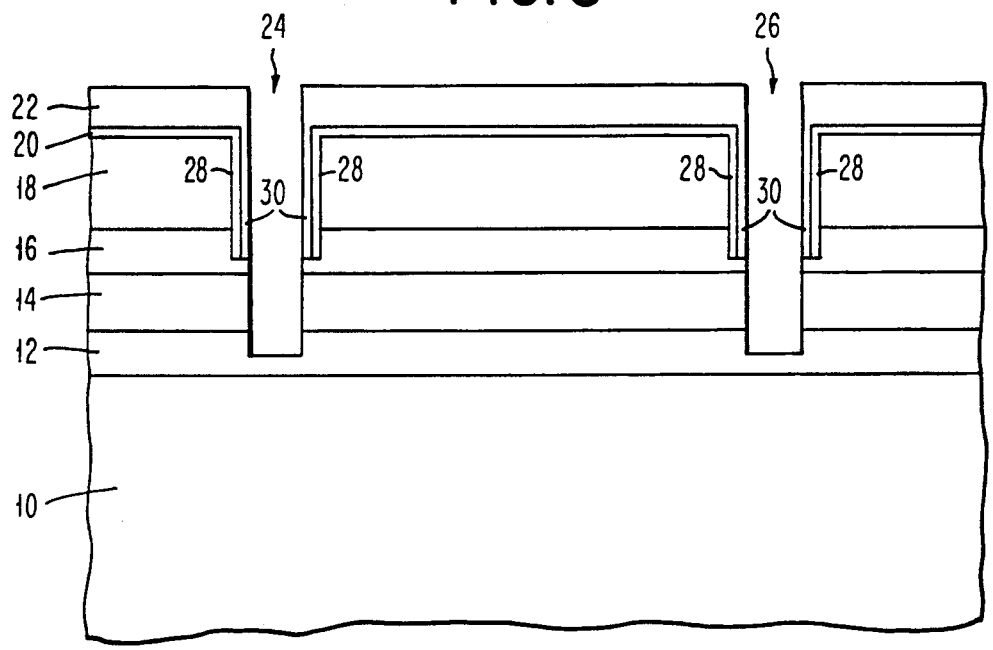

Using the top Si$_3$N$_4$ layer 22 as a mask, the grooves 24 and 26 are further etched through the intrinsic silicon layer 14 and stopped in the p++ silicon layer 12 as shown in FIG. 3.

Figure 4:
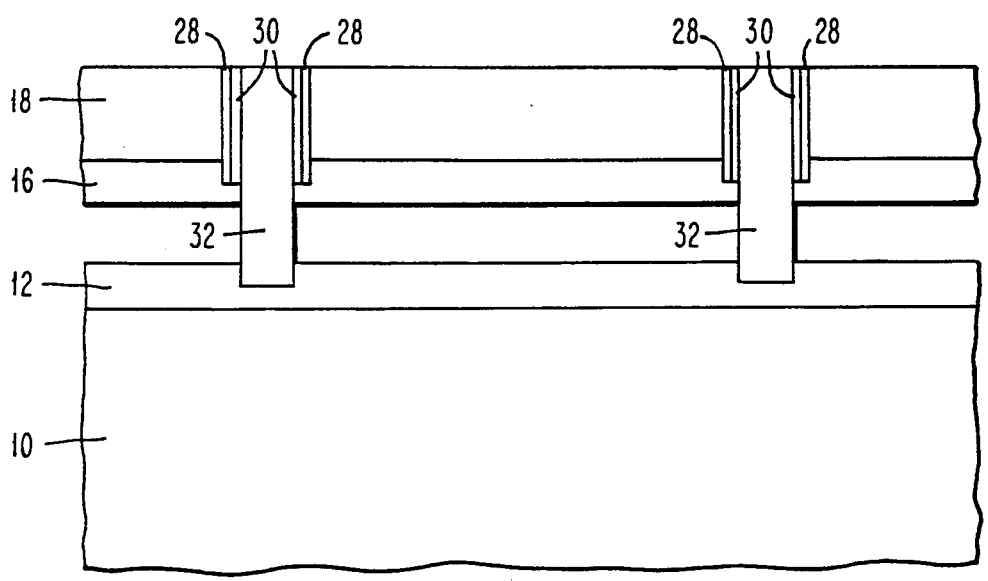

A selective wet etch, for example, may be then employed to remove the remainder of intrinsic silicon layer 14. KOH etch is used to etch the intrinsic silicon layer 14 as it has a high ratio relative to both p++ silicon and Si$_3$N$_4$. The wet etch proceeds long enough for the p++ silicon layer 16 to be totally undercut, leaving an air gap between layers 16 and 12. The grooves 24 and 26 run in only one direction, so that silicon layer 16 is supported at the ends of the structure. A high pressure oxidation step is then performed to form a bottom insulator consisting of the oxidized p++ silicon layer 12 and on an upper insulator consisting of the oxidized p++ silicon layer 16. Because the p++ silicon material oxidizes much faster than lightly doped silicon, the p++ layers 12 and 16 are oxidized quickly and the oxidation step is stopped. Grooves 24 and 26 are then filled with insulating material 32 such as SiO$_2$ or BPSG. The structure is then planarized and the top SiO$_2$ layer 20 and Si$_3$N$_4$ layer 22 are removed. The resulting structure, illustrated in FIG. 4, is then ready for conventional processing.

The described process results in a structure of very good material quality and very low parasitic capacitances. The use of low temperature epitaxy allows the growth of the layers 12, 14 and 16. Through the use of reactive ion etching and selective oxidation, the intrinsic silicon layer 14 can be etched out leaving a layer of silicon on top of an air gap. Oxidation of the p++ silicon layers 12 and 14 allows the formation of a high quality bottom insulator, leaving high quality epitaxial silicon on a SiO$_2$-on-air gap insulator.

In an alternative embodiment, grooves 24 and 26 can be filled with polysilicon instead of insulating material 32 such as SiO$_2$ or BPSG. The polysilicon filled grooves 24 and 26 thus provide a low resistance electrical path to ground so that the SOI islands do not float above ground.

Also, grooves 24 and 26 may be embodied as a single groove, examples being a U-shaped or H shaped single groove that would achieve the same cross section as shown in the drawings.

While the invention has been shown with respect to particular embodiments thereof, it will be apparent to those of skill in the art that variations can be made therein without departing from the spirit and scope of the present invention. For example, those of skill in the art will foresee additional applications of this technique to produce many different structures, some of which may be novel.

Having thus described our invention what we claim as new and desire to secure as Letters Patent, is:

1. A method for fabricating a silicon-on-insulator structure comprising the steps of:
   Step 1: forming a first layer of p++ silicon on a silicon substrate;
   Step 2: forming a layer of intrinsic silicon on said first layer of p++ silicon;
   Step 3: forming a second layer of p++ silicon on said layer of intrinsic silicon;
   Step 4: forming a layer of p- silicon on said second layer of p++ silicon;
   Step 5: forming at least one groove through said layer of p- silicon, said second layer of p++ silicon, said intrinsic layer and into said first layer of p++ silicon;
   Step 6: filling said at least one groove with suitable material;
   Step 7: and removing said layer of intrinsic silicon to provide an air gap space wherein said layer of p- silicon and said second layer of p++ silicon are supported above said air gap by said at least one filled groove extending into said first layer of p++ silicon below said air gap space.

2. A method according to claim 1 further including the step of
   Step 8: oxidizing said first and second p++ layers to form insulating layers of silicon dioxide above and below said air gap space.

3. A method according to claim 1 further including the step of
   Step 8: wet etching said first and second p++ layers and oxidizing to form layers of silicon dioxide above and below said air gap space.

4. A method according to claim 1 wherein said material filling said at least one groove is electrically insulating material.

5. A method according to claim 1 wherein said material filling said at least one groove is silicon dioxide.

6. A method according to claim 1 wherein said material filling said at least one groove is BPSG.

7. A method according to claim 1 wherein said material filling said at least one groove is electrically conducting.

8. A method according to claim 1 wherein said material filling said at least one groove is polysilicon.

* * * * *